United States Patent
Wong

(10) Patent No.: US 7,945,831 B2
(45) Date of Patent: May 17, 2011

(54) GATING TDO FROM PLURAL JTAG CIRCUITS

(75) Inventor: Robert B. Wong, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 236 days.

(21) Appl. No.: 12/263,443

(22) Filed: Oct. 31, 2008

(65) Prior Publication Data
US 2010/0109678 A1    May 6, 2010

(51) Int. Cl.
*G01R 31/28* (2006.01)
(52) U.S. Cl. .......... 714/727; 714/30; 714/724; 714/726; 714/729; 710/32
(58) Field of Classification Search .................. None
See application file for complete search history.

(56) References Cited

U.S. PATENT DOCUMENTS

| 6,393,081 | B1 | 5/2002 | Whetsel |
| 7,219,283 | B2 * | 5/2007 | Whetsel ..................... 714/727 |
| 2009/0077438 | A1 * | 3/2009 | Schuttert et al. ............ 714/727 |

OTHER PUBLICATIONS

"IEEE Standard Test Access Port and Boundary-Scan Architecture," Feb. 15, 2009, pp. 1-139.

* cited by examiner

*Primary Examiner* — John P Trimmings
(74) *Attorney, Agent, or Firm* — Lawrence J. Bassuk; W. James Brady; Frederick J. Telecky, Jr.

(57) ABSTRACT

Various apparatuses, methods and systems for dual JTAG controllers with shared pins disclosed herein. For example, some embodiments provide a boundary scan apparatus having a first boundary scan circuit with a first plurality of control inputs, a second boundary scan circuit with a second plurality of control inputs, and a plurality of boundary scan control signals connected to the first plurality of control inputs on the first boundary scan circuit and to the second plurality of control inputs on the second boundary scan circuit. At least two of the plurality of boundary scan control signals are connected between the first boundary scan circuit and the second boundary scan circuit in a crossover fashion.

3 Claims, 5 Drawing Sheets

GATING TDO FROM PLURAL JTAG CIRCUITS

BACKGROUND

As electronic circuits have become increasingly complex and miniaturized, they have also become more difficult to test. Among the various techniques that are used to test them is the "Standard Test Access Port and Boundary Scan Architecture" (IEEE 1149.1). This standard provides a way to read and to change the state of input and output (I/O) pins on an integrated circuit. The standard was developed by the Joint Test Action Group (JTAG), so the interface added to an integrated circuit to provide test access to the input and output pins is often called a JTAG interface. Signals between the core logic of the integrated circuit and the I/O pins on the integrated circuit that are to be accessed by the JTAG interface pass through a boundary scan register, with at least one cell in the boundary scan register for each I/O pin to be accessed. During normal operation, signals are passed through the boundary scan register without change. In a test mode, either the I/O pins or the core logic of the integrated circuit may be disconnected at the boundary scan register, allowing the JTAG interface to read and write values in the boundary scan register and thus to the devices that remain connected to the boundary scan register, whether the I/O pins or the core logic of the integrated circuit. The JTAG interface adds four or five pins to the interface of the integrated circuit, so that a testing device connected with the JTAG interface can read and write the values in the boundary scan register and other registers such as an instruction register and data registers. The JTAG interface is a serial interface that shifts values in and out of the boundary scan register or other registers one bit at a time, under the control of a Test Access Port (TAP) controller.

Often, multiple devices in an electronic circuit include JTAG interfaces allowing each device to be tested. This may be accomplished in conventional systems by providing a separate JTAG interface for each device, requiring separate JTAG pins to be added to each device. This may also be accomplished in conventional systems by providing a single set of JTAG pins in the electronic circuit and daisy chaining multiple TAP controllers together from the single set of JTAG pins. Although this method does allow multiple JTAG interfaces to share a single set of JTAG pins, it requires that instructions written to the daisy chained TAP controllers be concatenated and that data read from the daisy chained TAP controllers be divided to separate the concatenated data.

SUMMARY

Various apparatuses, methods and systems for dual JTAG controllers with shared pins disclosed herein. For example, some embodiments provide a boundary scan apparatus having a first boundary scan circuit with a first plurality of control inputs, a second boundary scan circuit with a second plurality of control inputs, and a plurality of boundary scan control signals connected to the first plurality of control inputs on the first boundary scan circuit and to the second plurality of control inputs on the second boundary scan circuit. At least two of the plurality of boundary scan control signals are connected between the first boundary scan circuit and the second boundary scan circuit in a crossover fashion.

In other instances of the aforementioned boundary scan apparatus, a plurality of boundary scan data signals are also connected to the first boundary scan circuit and the second boundary scan circuit. These boundary scan data signals may include a test data input signal connected to test data inputs on the first and second boundary scan circuits and a test data output signal connected to test data outputs on the first and second boundary scan circuits.

In various cases, the first plurality of control inputs and the second plurality of control inputs on the first and second boundary scan circuits are both of a same type of control inputs. In some particular embodiments, the boundary scan control signals that are connected in crossover fashion include a test clock signal and a test mode select signal. The first plurality of control inputs on the first boundary scan circuit may include a first test clock signal input and a first test mode select input, and the second plurality of control inputs on the second boundary scan circuit may include a second test clock signal input and a second test mode select input. The test clock signal may be connected to the first test clock signal input on the first boundary scan circuit and to the second test mode select input on the second boundary scan circuit. The test mode select signal may be connected to the first test mode select input on the first boundary scan circuit and to the second test clock signal input on the boundary scan circuit.

Some particular embodiments of the boundary scan apparatus may be adapted to operate either the first boundary scan circuit or the second boundary scan circuit in mutually exclusive fashion by transitioning the test mode select signal after rising edges of the test clock signal in a first mode to operate the first boundary scan circuit and transitioning the test mode select signal before rising edges of the test clock signal in a second mode to operate the second boundary scan circuit. The test mode select signal may be transitioned after rising edges of the test clock signal by applying data to the test mode select signal and a clock to the test clock signal in the first mode, and the test mode select signal may be transitioned before rising edges of the test clock signal by applying the clock to the test mode select signal and data to the test clock signal in the second mode. The first boundary scan circuit may be adapted to enter a test-logic-reset state after at least five rising edges of the test clock signal in the first mode and the second boundary scan circuit may be adapted to enter a test-logic-reset state after at least five rising edges of the test mode select signal in the second mode.

In some particular embodiments of the boundary scan apparatus, the plurality of boundary scan control signals includes a test reset signal connected to a first test reset input on the first boundary scan circuit and to a second test reset input on the second boundary scan circuit.

In some particular embodiments of the boundary scan apparatus, the first test data output and the second test data output are connected to the test data output signal through a multiplexer that is controlled by an output enable signal from at least one of the first and second boundary scan circuits.

Other embodiments provide a method of testing an electronic circuit. The method includes operating a first boundary scan controller and deactivating a second boundary scan controller through a shared set of boundary scan interface pins by applying a clock signal to a first pin in the shared set of boundary scan interface pins and a data signal to a second pin in the shared set of boundary scan interface pins. The method also includes operating the second boundary scan controller and deactivating the first boundary scan controller through the shared set of boundary scan interface pins by applying the clock signal to the second pin in the shared set of boundary scan interface pins and the data signal to the first pin in the shared set of boundary scan interface pins. The data signal transitions high when the clock signal is already asserted.

In various instances of the aforementioned method, the deactivating includes applying a predetermined number of pulses to the data signal before operating the other boundary scan controller. In some particular embodiments, the clock signal is held asserted while applying the pulses to the data signal.

Other embodiments provide an electronic circuit having a plurality of boundary scan interface pins including a test mode select pin, a test clock pin, a test reset pin, a test data input pin and a test data output pin. The electronic circuit also includes a first boundary scan controller with a plurality of control inputs and a plurality of data signals. The plurality of control inputs includes a test mode select signal, a test clock signal and a test reset signal, and the plurality of data signals includes a test data input signal and a test data output signal. The electronic circuit also includes a second boundary scan controller with a plurality of control inputs and a plurality of data signals. The plurality of control inputs includes a test mode select signal, a test clock signal and a test reset signal, and the plurality of data signals includes a test data input signal and a test data output signal. The test mode select pin is connected to the first boundary scan controller test mode select signal and to the second boundary scan controller test clock signal. The test clock pin is connected to the first boundary scan controller test clock signal and to the second boundary scan controller test mode select signal. The test reset pin is connected to the first boundary scan controller test reset signal and to the second boundary scan controller test reset signal. The test data input pin is connected to the first boundary scan controller test data input signal and to the second boundary scan controller test data input signal. The test data output pin is connected to the first boundary scan controller test data output signal and to the second boundary scan controller test data output signal through a multiplexer controlled by a test data output enable signal from at least one of the first and second boundary scan controller. The electronic circuit is adapted to operate either the first boundary scan controller or the second boundary scan controller in mutually exclusive fashion by transitioning the test mode select pin after rising edges of the test clock pin in a first mode to operate the first boundary scan controller and transitioning the test mode select pin before rising edges of the test clock pin in a second mode to operate the second boundary scan controller. The test mode select pin is transitioned after rising edges of the test clock pin by applying data to the test mode select pin and a clock to the test clock pin in the first mode. The test mode select pin is transitioned before rising edges of the test clock pin by applying the clock to the test mode select pin and data to the test clock pin in the second mode. The first boundary scan controller is adapted to enter a test-logic-reset state after at least five rising edges of the test clock pin in the first mode, and the second boundary scan controller is adapted to enter a test-logic-reset state after at least five rising edges of the test mode pin in the second mode.

This summary provides only a general outline of some particular embodiments. Many other objects, features, advantages and other embodiments will become more fully apparent from the following detailed description, the appended claims and the accompanying drawings.

BRIEF DESCRIPTION OF THE DRAWINGS

A further understanding of the various embodiments may be realized by reference to the FIGS. which are described in remaining portions of the specification. In the FIGS., like reference numerals may be used throughout several drawings to refer to similar components.

DESCRIPTION

The drawings and description, in general, disclose various embodiments of a boundary scan apparatus for testing an electronic circuit. The boundary scan apparatus may comprise any device for intercepting electrical signals at the interface or boundary of an electronic circuit during testing, such as for example a JTAG system or a portion of a JTAG system under any JTAG specification. The system includes two independent JTAG circuits each containing a JTAG TAP controller and a set of JTAG instruction and data registers. The two JTAG circuits are controlled through a shared set of JTAG interface pins or other connectors. During normal operation of one of the JTAG circuits, the other of the JTAG circuits automatically enters an inactive Test-Logic-Reset state. The JTAG system disclosed herein allows the use of two JTAG circuits without requiring two sets of JTAG interface pins, and without a traditional daisy chaining of JTAG circuits which require attention to the states of the multiple JTAG circuits as instructions and data are passed through the daisy chain.

Figure 1:
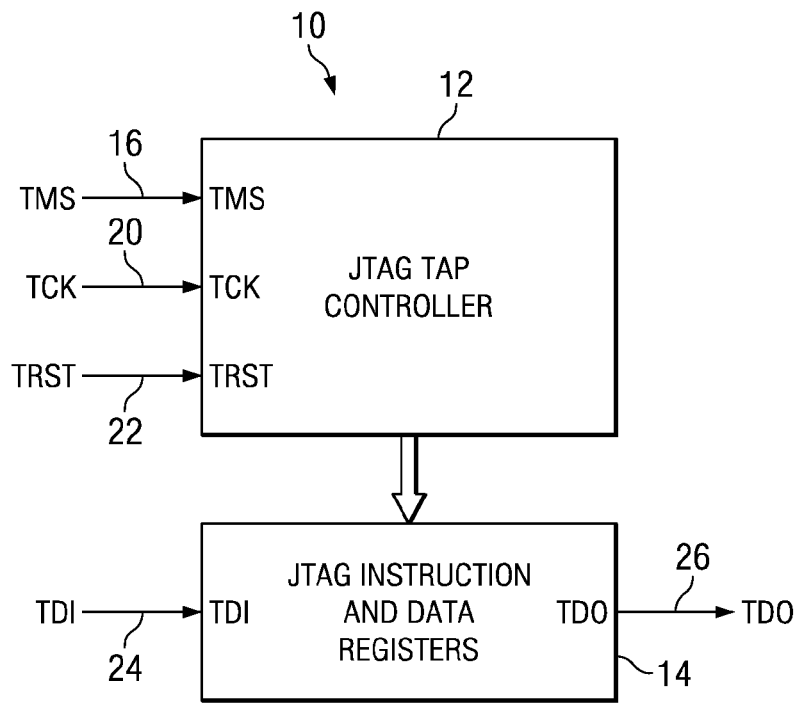
FIG. 1 is a block diagram depicting a JTAG interface.

Referring now to FIG. 1, an example of a JTAG circuit 10 will be described as it may be applied to the dual JTAG system. However, it is important to note that the JTAG circuit 10 is not limited to the particular configuration of FIG. 1 and may be adapted as desired without precluding its use in a dual JTAG system. The JTAG circuit 10 includes a JTAG TAP controller 12, also referred to herein as a JTAG controller, and a set of JTAG instruction and data registers 14. The JTAG controller 12 has a test mode select (TMS) input 16, a test clock (TCK) input 20, and optionally has a test reset (TRST) input 22. The JTAG circuit 10 is a serial device that can be placed in a number of different states by different sequences of values on the TMS input 16, with each successive value on TMS 16 being clocked in by the TCK 20. That is, when a rising edge occurs on TCK 20, the value of the TMS 16 is read and processed by the JTAG controller 12. In one particular embodiment, the JTAG controller 12 has 16 different operating states, and different sequences of values on TMS 16 place the JTAG controller 12 in the desired state. Generally, from any of the 16 states, a series of ones on TMS 16 will return the JTAG controller 12 to the inactive Test-Logic-Reset state. If the JTAG controller 12 includes a TRST input 22, it may also be asserted to asynchronously reset the JTAG controller 12 to the inactive Test-Logic-Reset state whenever desired.

The instruction and data registers 14 may include a number of registers such as an instruction register, ID register, and boundary scan register. When the JTAG controller 12 is placed in a Shift-DR or Shift-IR state, values may be shifted serially in and out of the instruction and data registers 14 on the JTAG controller 12 on a test data input (TDI) and a test data output (TDO) 26. This enables the JTAG circuit 10 to intercept signals between the core logic in an integrated circuit and the package pins on the integrated circuit, both reading and writing values there. The JTAG circuit 10 is thus included in an integrated circuit to test the core logic or to test the interconnects between the integrated circuit and other devices. By controlling two independent JTAG circuits using a single set of JTAG interface pins 28, multiple circuits can be tested with just four or five dedicated pins.

Figure 2:
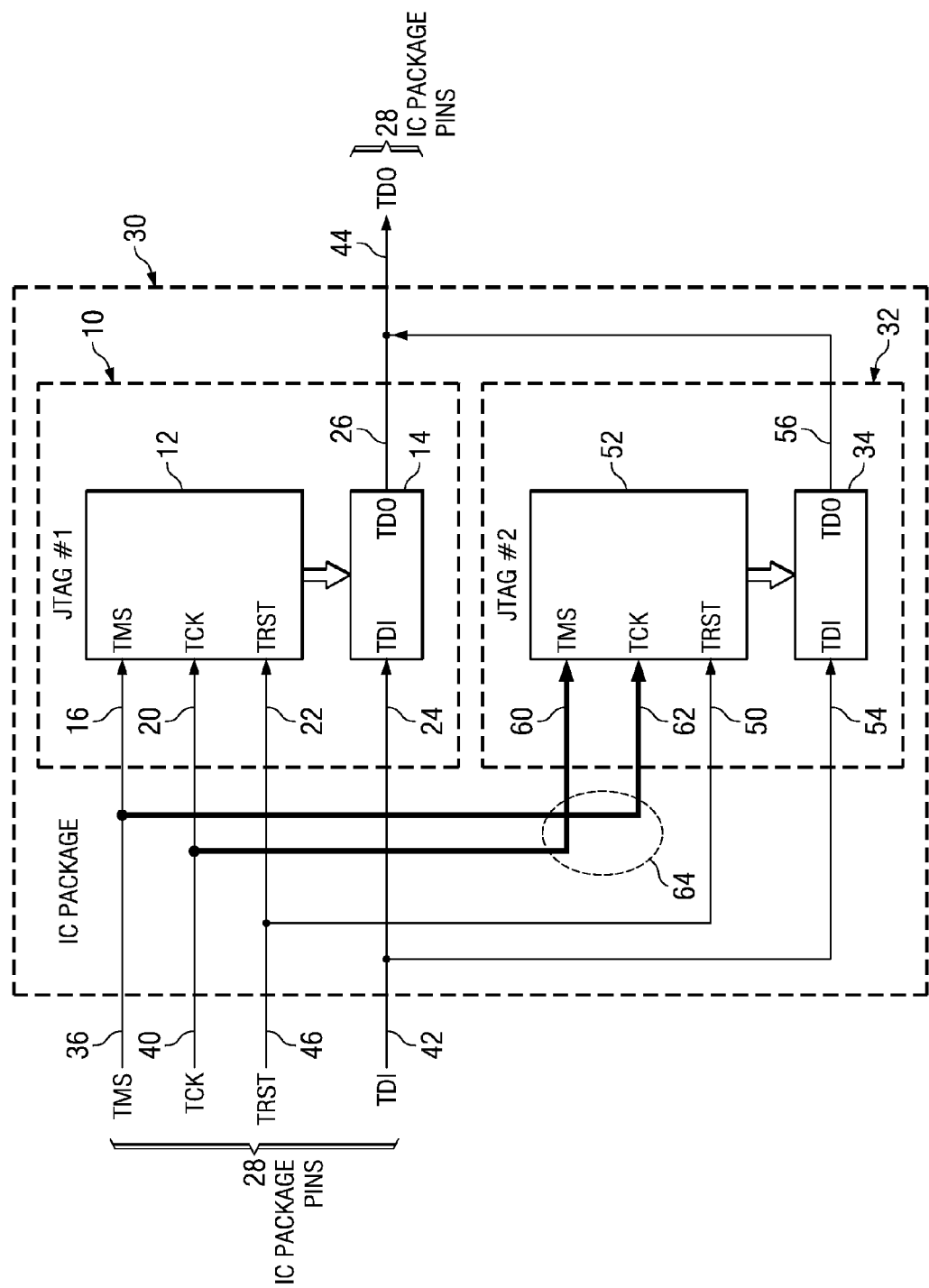
FIG. 2 is a block diagram depicting a pair of JTAG circuits connected to share a single set of pins.

Referring now to FIG. 2, the dual JTAG system as it may be included in an integrated circuit 30 will be described. Two JTAG circuits 10 and 32 are placed in the integrated circuit 30. As described above, the particular configuration of the JTAG circuits 10 and 32 is not limited to the examples set forth herein. The JTAG circuits 10 and 32 may even have different configurations if desired. For example, the JTAG circuit 32 may include at least partially different instruction and data registers 34 than those 14 in the JTAG circuit 10. Four or five JTAG pins are provided on the integrated circuit 30 to access the JTAG circuits 10 and 32, including a TMS pin 36, TCK pin 40, TDI pin 42, TDO pin 44, and optional TRST pin 46. The TRST pin 46, if included, is connected in parallel fashion to the TRST input 22 on the first JTAG controller 12 and to the TRST input 50 on the second JTAG controller 52. The TDI pin 42 is connected to the TDI input 24 on the first JTAG controller 12 and to the TDI input 54 on the second JTAG controller 52. The TDO pin 44 is connected to the TDO output 26 on the first JTAG controller 12 and to the TDO output 56 on the second JTAG controller 52.

The ability to automatically control the two independent JTAG controllers 12 and 32 is provided by connecting the TMS input 60 and the TCK input 62 on the second JTAG controller 52 in a crossover 64 fashion and by swapping or interchanging the clock and data signals applied to the TMS pin 36 and TCK pin 40. Specifically, the TMS pin 36 is connected to the TMS input 16 on the JTAG controller 12 and to the TCK input 62 on the second JTAG controller 52. The TCK pin 40 is connected to the TCK input 20 on the first JTAG controller 12 and to the TMS input 60 on the second JTAG controller 52. When operating the first JTAG controller 12, a clock is applied to the TCK pin 40 and a data signal is applied to the TMS pin 36 to control the state of the first JTAG controller 12. This means that the clock is applied the TMS input 60 of the second JTAG controller 52 and the data signal is applied to the TCK input 62 of the second JTAG controller 52. As will be described in more detail below, this will automatically place the second JTAG controller 52 in the inactive Test-Logic-Reset state when the first JTAG controller 12 is operated, allowing the first JTAG controller 12 to be operated without conflict from the second JTAG controller 52. When operating the second JTAG controller 52, the clock and data applied to the TMS pin 36 and TCK pin 40 are swapped. The clock is applied to the TMS pin 36 and the data is applied to the TCK pin 40. This means that the clock is applied to the TCK input 62 of the second JTAG controller 52 and to the TMS input 16 of the first JTAG controller 12, while the data is applied to the TMS input 60 of the second JTAG controller 52 and to the TCK input 20 of the first JTAG controller 12. This will automatically place the first JTAG controller 12 in the inactive Test-Logic-Reset state when the second JTAG controller 52 is operated, allowing the second JTAG controller 52 to be operated without conflict from the first JTAG controller 12. When the first JTAG controller 12 or the second JTAG controller 52 is in the Test-Logic-Reset mode, their associated boundary scan register is placed into a transparent mode and their TDO output 26 or 56 may be placed into a high impedance mode, so that the inactive JTAG controller 12 or 52 has no effect on the overall electronic circuit containing the inactive JTAG controller 12 or 52.

Figure 3:
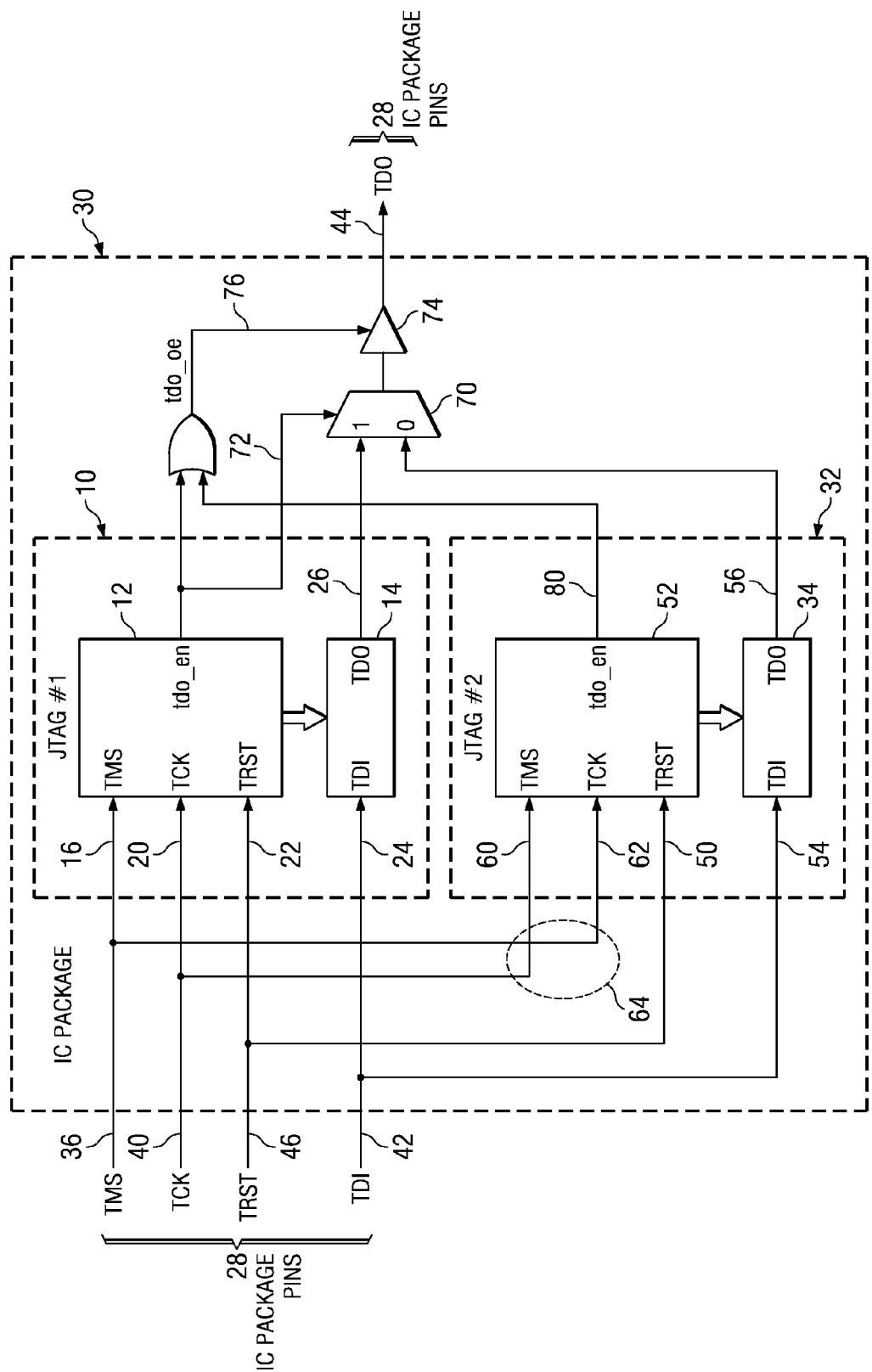
FIG. 3 is a block diagram depicting a pair of JTAG circuits connected to share a single set of pins with multiplexed data outputs.

Referring now to FIG. 3, the TDO output 26 from the first JTAG circuit 10 and the TDO output 56 from the second JTAG circuit 32 may be connected to the TDO pin 44 through a multiplexer 70 in one particular embodiment. The multiplexer connects either the TDO output 26 from the first JTAG circuit 10 or the TDO output 56 from the second JTAG circuit 32 to the TDO pin 44, controlled by a signal tdo_en signal 72 from one of the two JTAG circuits 10 or 32. The tdo_en signal 72 may be generated in the first JTAG controller 12 or second JTAG controller 52 based on the state of the JTAG controller 12 or 52. For example, the tdo_en signal 72 may be asserted when the JTAG controller 12 or 52 is in the Shift-DR or Shift-IR states, when that particular JTAG controller 12 or 52 is attempting to output data from the TDO output 26 or 56. The signal from the multiplexer 70 may further be buffered by a driver 74 before it reaches the TDO pin 44. The driver 74 may be enabled by a signal 76 generated by combining the tdo_en signal 72 from the first JTAG controller 12 with the tdo_en signal 80 from the second JTAG controller 52 in an OR gate 82.

Figure 4:
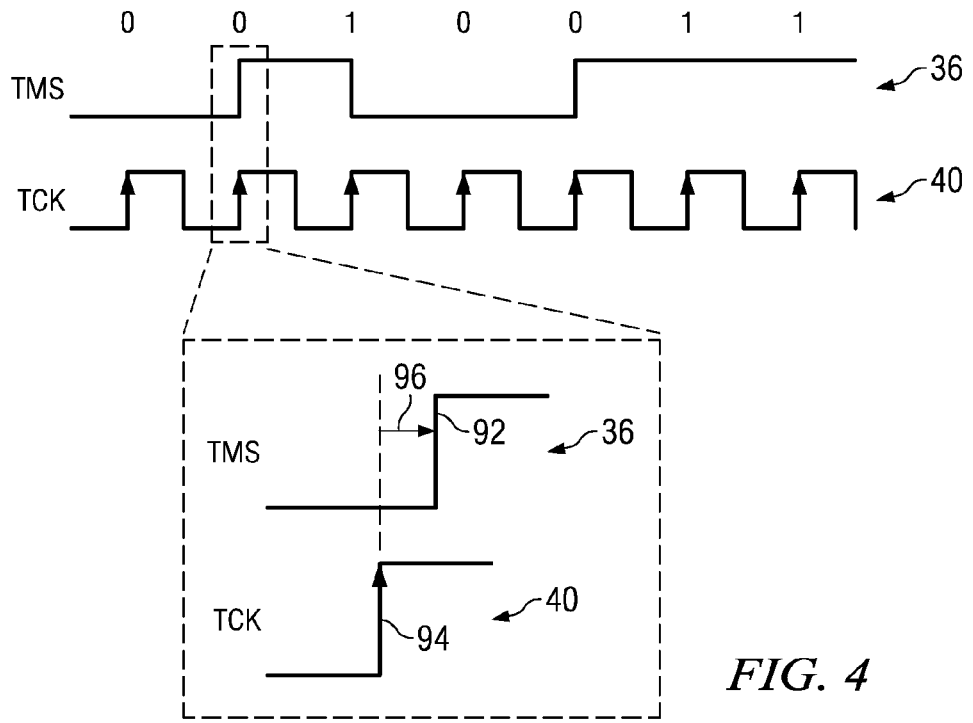
FIG. 4 is a timing diagram of test clock and test mode select signals as seen at IC package pins and used to control the first of the pair of JTAG circuits of FIG. 2.

Referring now to FIG. 4, the timing of the TCK and TMS signals when operating the first JTAG circuit 10 and deactivating the second JTAG circuit 32 will be described. A clock signal is applied to the TCK pin 40 on the integrated circuit 30 and a data signal is applied to the TMS pin 36. The values carried by the data signal are established based on the desired states in the first JTAG controller 12. Note that transitions (e.g., 92) on the data signal occur after rising edges (e.g., 94) on the clock signal. In other words, there is a delay 96 after rising edges (e.g., 94) on the clock signal before the data signal is allowed to transition (e.g., 92). This provides the longest possible setup and hold time in the data signal in preparation for the next rising edge on the clock signal, so that the data is stable when the clock again transitions to a 1, in a high or asserted state. Because of this timing relationship between the clock and data signals, every time the data transitions, the clock is already in an asserted state. Because the TMS pin 36 is connected to the TMS input 16 of the first JTAG controller 12 and the TCK pin 40 is connected to the TCK input 20 of the first JTAG controller 12, the first JTAG controller 12 functions normally in this operational mode. However, because the TMS pin 36 is connected to the TCK input 62 of the second JTAG controller 52 and the TCK pin 40 is connected to the TMS input 60 of the second JTAG controller 52, each time the data signal on the TMS pin 36 causes a transition at the TCK input 62 of the second JTAG controller 52, the TMS input 60 of the second JTAG controller 52 has already been asserted by the clock signal on the TCK pin 40. This presents a series of ones at the TMS input 60 of the second JTAG controller 52 which places it in the inactive Test-Logic-Reset state, all during the normal operation of the first JTAG circuit 10.

Figure 5:
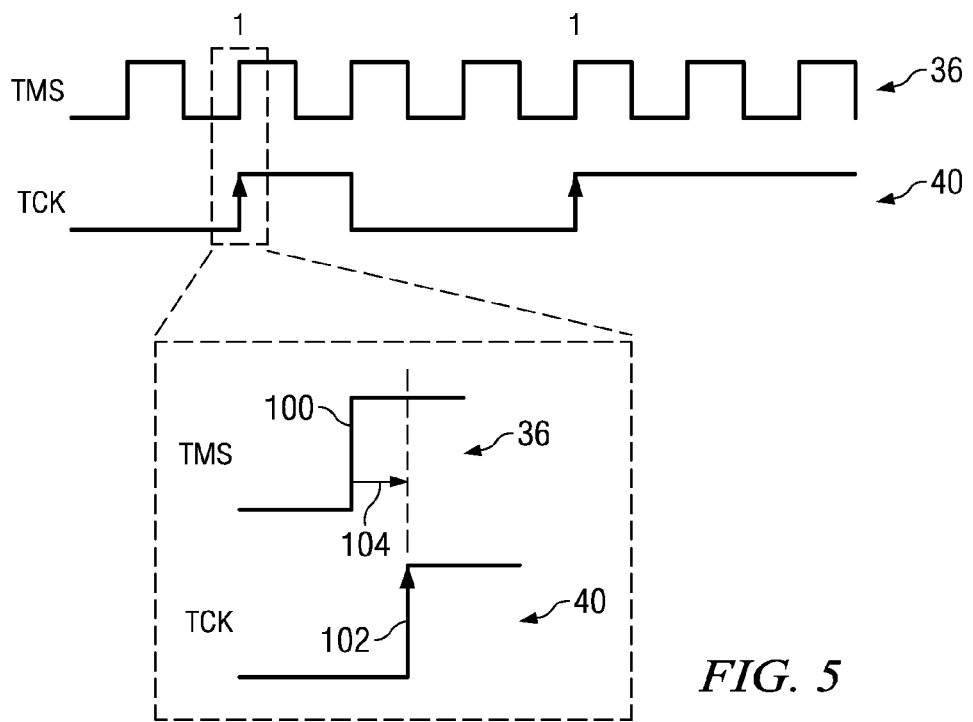
FIG. 5 is a timing diagram of test clock and test mode select signals as seen at IC package pins and used to control the second of the pair of JTAG circuits of FIG. 2.

Referring now to FIG. 5, the timing of the TCK and TMS signals when operating the second JTAG circuit 32 and deactivating the first JTAG circuit 10 will be described. In this operational mode, the clock signal is applied to the TMS pin 36 on the integrated circuit 30 and the data signal is applied to the TCK pin 40. Therefore, transitions (e.g., 100) in the clock signal on the TMS pin 36 occur after rising edges (e.g., 102) on the data signal on the TCK pin 40. In other words, there is a delay 104 after rising edges (e.g., 100) on the clock signal before the data signal is allowed to transition (e.g., 102). Because the TMS pin 36 is connected to the TCK input 62 of the second JTAG controller 52 and the TCK pin 40 is connected to the TMS input 60 of the second JTAG controller 52, transitions in the data signal at the TMS input 60 occur after rising edges in the clock signal at the TCK input 62, and the second JTAG controller 52 functions normally as controlled by the data signal connected to the TCK pin 40 of the integrated circuit 30. However, because the TMS pin 36 is connected to the TMS input 16 of the first JTAG controller 12 and the TCK pin 40 is connected to the TCK input 20 of the first JTAG controller 12, and because the clock signal is applied to the TMS pin 36 while the data signal is applied to the TCK pin 40, each time the data signal on the TCK pin 40 causes a transition at the TCK input 20 of the first JTAG controller 12 the TMS input 16 of the first JTAG controller 12 has already been asserted by the clock signal on the TMS pin 36. This presents a series of ones at the TMS input 16 of the first JTAG controller 12 which places it in the inactive Test-Logic-Reset state, all during the normal operation of the second JTAG circuit 32.

As described above with respect to FIGS. 4 and 5, swapping the clock and data signals applied to the TMS pin 36 and TCK pin 40 of the integrated circuit 30 changes the order of transitions of the clock and data signals presented at the TMS 16 and 60 and TCK 20 and 62 inputs of the two JTAG controllers 12 and 52. This is because there is always a rising edge on the clock before a transition of the data signal, regardless of whether those signals are swapped at the pins 36 and 40 of the integrated circuit 30. In other words, the standard timing relationship between the clock and data signals is maintained, although the clock and data signals are supplied to different pins. Thus, the order of transitions between the clock and data signals at the first JTAG controller 12 and second JTAG controller 52 is changed when the clock and data signals are swapped at the pins 36 and 40.

To restate it another way, the dual JTAG apparatus is adapted to operate either a first JTAG circuit 10 or a second JTAG circuit 32 in mutually exclusive fashion by transitioning the test mode select signal (the signal at the TMS pin 36) after rising edges of the test clock signal (the signal at the TCK pin 40) in a first mode to operate the first JTAG circuit and transitioning the test mode select signal (again, the signal at the TMS pin 36) before rising edges of the test clock signal (again, the signal at the TCK pin 40) in a second mode to operate the second JTAG circuit. Transitioning the test mode select signal after rising edges of the test clock signal in a first mode means that the test mode select signal is asserted only when the clock signal is already asserted. Because the TCK and TMS signals are swapped or connected in crossover fashion on the second JTAG circuit 32, this means that the test mode select signal will be clocking the TCK input 62 of the second JTAG circuit 32 and that every time it is asserted, the test clock signal will be providing an asserted value to the TMS input 60 of the second JTAG circuit 32 which will eventually put the second JTAG circuit 32 in a Test-Logic-Reset state as the second JTAG circuit 32 works its way through the state diagram of FIG. 6 to the Test-Logic-Reset state. In this embodiment, transitioning the test mode select signal before rising edges of the test clock signal in the second mode may be achieved by applying a clock to the test mode select signal (at TMS pin 36) and the test mode select data to the test clock signal (at TCK pin 40). Because data still transitions after a rising edge on the clock, this means that the test clock signal is asserted only when the test mode select signal is already asserted. Each time the test clock signal is asserted, the test mode select signal will be providing an asserted value to the TMS input 16 of the first JTAG circuit 10 which will eventually put the first JTAG circuit 10 in a Test-Logic-Reset state.

The clock and test mode select data signals may be generated and applied to the TCK 40 and TMS 36 pins in any desired way. For example, they may be generated in a tester connected to the circuit board containing the integrated circuit 30, or may be generated by a programmable chip on the circuit board. The signals from the source such as the tester or the programmable chip may be programmed to be swapped at the source, or the two signals could be swapped by any other suitable means such as in a multiplexer before reaching the TMS pin 36 and TCK pin 40.

The delay after a rising edge on the test clock signal before transitions on the test mode select signal may be set to a predetermined amount if desired to guarantee that the JTAG controller being deactivated always receives a one at the TMS input 16 or 60 and that the test mode select signal is stable before the next rising edge on the test clock signal. For example, the skew between the test mode select signal and the rising edge of the test clock signal should be at least the setup time of a flip flop to avoid metastability in the JTAG controller being deactivated.

Figure 6:
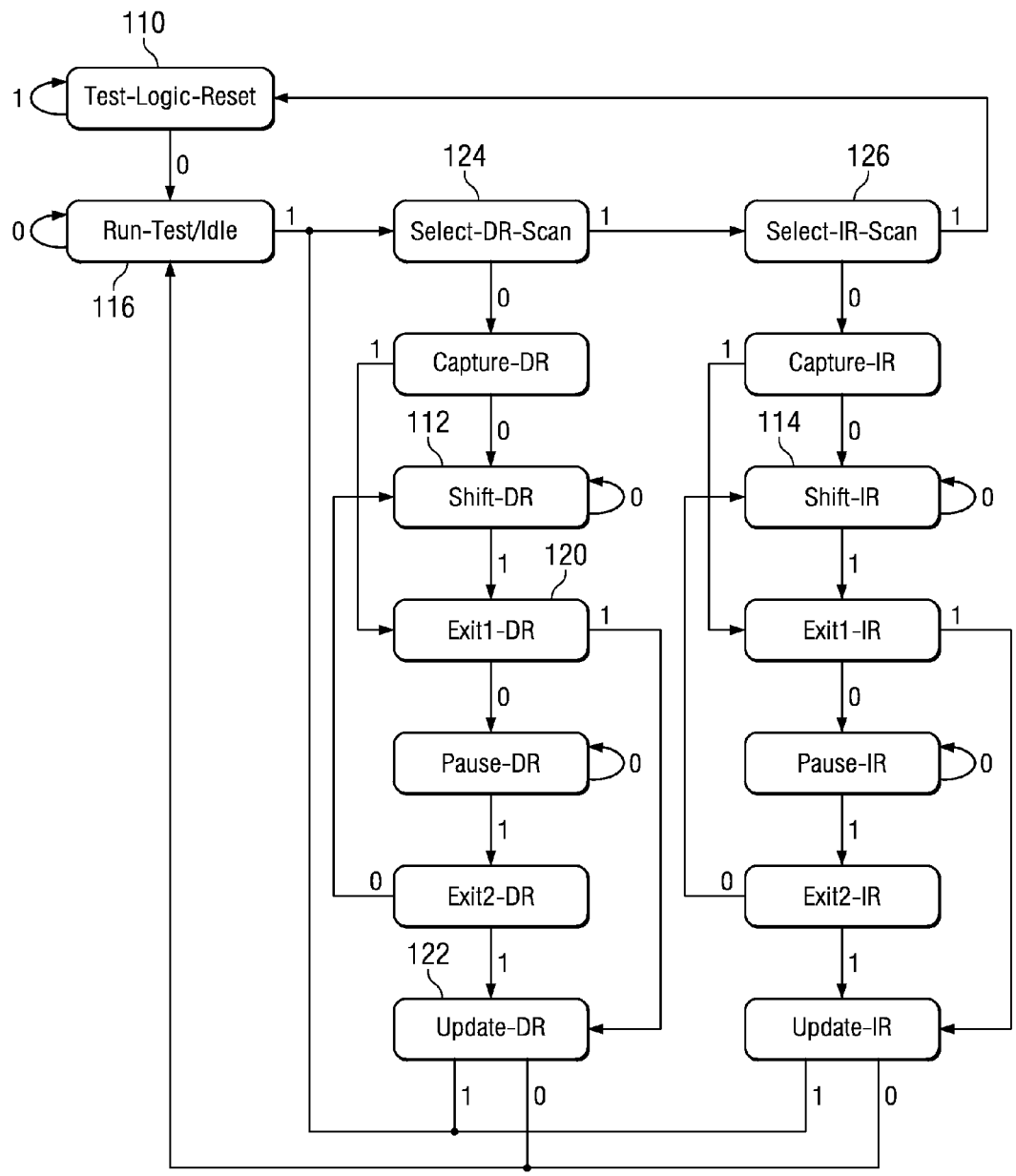
FIG. 6 is an JTAG controller state diagram.

The states of the JTAG controllers 12 and 52 in one embodiment are illustrated in the state diagram of FIG. 6. For example, the JTAG controllers 12 and 52 include a Test-Logic-Reset state 110, a Shift-DR state 112, a Shift-IR state 114, etc. Numbers on the transitions between states in the state diagram of FIG. 6 indicate the value on the test mode select signal causing each transition. A repeated value of one when in the Test-Logic-Reset state 110 keeps the JTAG controller 12 or 52 in the Test-Logic-Reset state 110. A zero when in the Test-Logic-Reset state 110 moves the JTAG controller 12 or 52 to the Run-Test/Idle state 116. Note that from any state in the state diagram, a series of ones will eventually return the JTAG controller 12 or 52 to the Run-Test/Idle state 116. The JTAG controller (e.g., 12) being operated may be returned to the Test-Logic-Reset state by a series of ones on the test mode select signal during rising edges of the clock signal, and the JTAG controller (e.g., 52) being deactivated may be returned to the Test-Logic-Reset state by a series of ones on the TMS input (e.g., 60) caused by the clock signal being asserted at each rising edge on the test mode select signal.

The JTAG controllers 12 and 52 may start in the Test-Logic-Reset state 110 by asserting the TRST pin 46, if provided. In this case, the JTAG controller being deactivated (e.g., 52) is kept in the Test-Logic-Reset state 110 by each pulse on the clock signal at the TMS input (e.g., 60) due to the crossover connection of the clock and data signals. If no TRST pin 46 is provided, the JTAG controllers 12 and 52 start in an undefined state, in which case both may be returned to the Test-Logic-Reset state either during normal operation or an initialization period. The initialization period may be provided, if desired, to provide a series of ones at the TMS input 16 or 60 of one or both of the JTAG controllers 12 and 52 as desired.

In one particular embodiment of an initialization period, the clock signal may be held in an asserted state while the data signal is pulsed five times. For example, to reset the second JTAG controller 52 before operating the first JTAG controller 12, the TCK pin 40 may be held high while applying at least five pulses to the TMS pin 36. The first JTAG controller 12 will be unaffected because the clock signal at the TCK input 20 will have no rising edges to clock in the data signal at the TMS input 16. The second JTAG controller 52, however, will be returned to the Test-Logic-Reset state 110 by the pulses from the TDO output 26 at the TCK input 62 while the TMS input 60 is held high. Similarly, to reset the first JTAG controller 12 before operating the second JTAG controller 52, the TMS pin 36 may be held high while applying at least five pulses to the TCK pin 40. The second JTAG controller 52 will be unaffected by the initialization while the first JTAG controller 12 will be returned to the Test-Logic-Reset state 110 from any other previous state.

The worst case reset path, beginning at a number of states including the Shift-DR state 112, requires a series of five ones on the test mode select signal to return to the Test-Logic-Reset state 110. For example, starting at the Shift-DR state 112, a first one leads to the Exit1-DR state 120, the next leads to the Update-DR state 122, then to the Select-DR-Scan state 124, then the Select-IR-Scan 126, then to the Test-Logic-Reset state 110.

Figure 7:
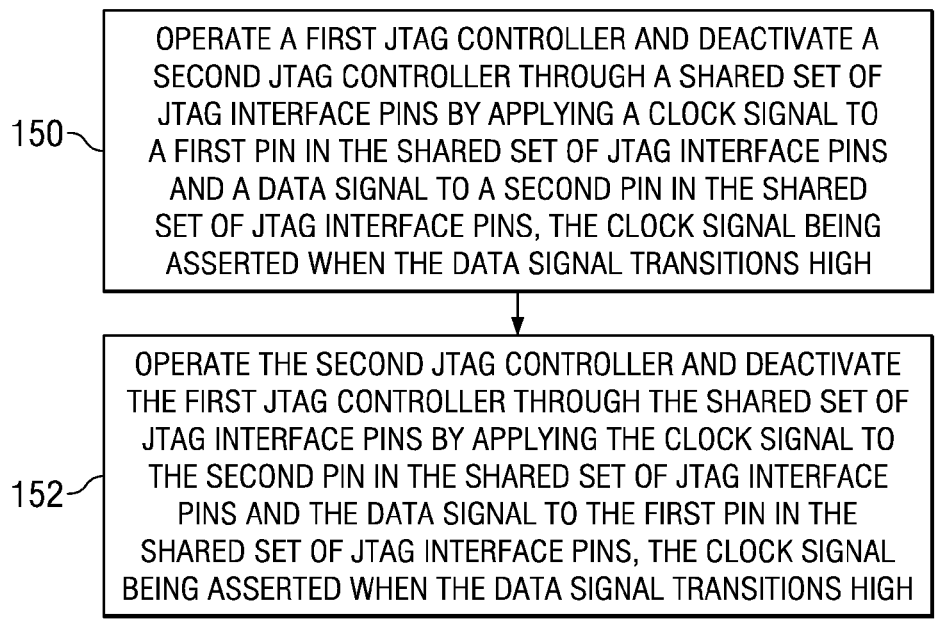
FIG. 7 is a flow chart of an operation for testing an electronic circuit.

Referring now to FIG. 7, an example of an operation for testing an electronic circuit will be summarized. A first JTAG controller (e.g., 12) is operated and a second JTAG controller (e.g., 52) is deactivated through a shared set of JTAG interface pins by applying a clock signal to a first pin in the shared set of JTAG interface pins and a data signal to a second pin in the shared set of JTAG interface pins. (Block 150) In one embodiment, the first pin is a TCK pin 40 and the second pin is a TMS pin 36 in an integrated circuit 30. The second JTAG controller is operated and the first JTAG controller is deactivated through the shared set of JTAG interface pins by applying the clock signal to the second pin in the shared set of JTAG interface pins and the data signal to the first pin in the shared set of JTAG interface pins. (Block 152) In both cases, the clock signal has already been asserted when the data signal transitions high. In some particular embodiments, the method may further include applying a series of pulses to the data signal at the second pin, and may hold the clock signal at the first pin in an asserted state while doing so, thereby providing a series of ones to the TMS input of the second JTAG controller without affecting the first JTAG controller.

The dual JTAG controllers sharing a single set of JTAG pins disclosed herein provide a simple and convenient way to test two different portions of an electronic circuit without requiring a separate set of JTAG interface pins and without the need to track the state of both JTAG controllers. The dual JTAG controllers may be used for any desired purpose in any suitable electronic circuit or circuits. For example, an ARM core being placed in the design of an integrated circuit may include a first JTAG controller for testing the ARM core inside the integrated circuit, and the overall integrated circuit may include a second JTAG controller for testing the overall integrated circuit. The two JTAG controllers may be controlled as described above using a single set of pins.

While illustrative embodiments have been described in detail herein, it is to be understood that the concepts disclosed herein may be otherwise variously embodied and employed, and that the appended claims are intended to be construed to include such variations, except as limited by the prior art.

What is claimed is:

1. A system comprising:
   A. first test access port circuitry having a data input, a data output, a clock input, a mode input, and a test data out enable output;
   B. second test access port circuitry having a data input, a data output, a clock input, a mode input, and a test data out enable output;
   C. a data input lead coupled to the data input of each test access port circuitry;
   D. a data output lead;
   E. a clock lead coupled to the clock input of the first test access port circuitry and to the mode input of the second test access port circuitry;
   F. a mode lead coupled to the mode input of the first test access port circuitry and to the clock input of the second test access port circuitry; and
   G. gating circuitry having a first input coupled to the data output of the first test access port circuitry, a second input coupled to the data output of the second test access port circuitry, a control input connected with the test data out enable output of one of the first and second test access port circuitry, and an output coupled with the data output lead.

2. The system of claim 1 in which the first test access port circuitry has a test reset input, the second test access port circuitry has a test reset input, and including a test reset input lead connected to the test reset input of the first and second test access port circuitry.

3. The system of claim 1 in which each test access port circuitry includes controller circuitry connected with an instruction register and a data register.

* * * * *